United States Patent [19]
Takahashi

[11] Patent Number: 6,034,550
[45] Date of Patent: Mar. 7, 2000

[54] MULTI-POWER IC DEVICE

[75] Inventor: Tadao Takahashi, Tokyo, Japan

[73] Assignee: Oki Electric Industry Co., Ltd., Tokyo, Japan

[21] Appl. No.: 08/861,623

[22] Filed: May 22, 1997

[30] Foreign Application Priority Data

May 28, 1996 [JP] Japan ................................. 8-133373

[51] Int. Cl.[7] .................................................. H03K 19/185
[52] U.S. Cl. .................................. 326/81; 326/83; 326/49
[58] Field of Search .................................. 326/31, 33, 34, 326/37, 49, 50, 80, 81, 83, 86; 327/407, 408

[56] References Cited

U.S. PATENT DOCUMENTS

| | | | |
|---|---|---|---|
| 4,929,853 | 5/1990 | Kim et al. | 326/81 |
| 5,073,726 | 12/1991 | Kato et al. | 326/83 |
| 5,268,599 | 12/1993 | Matsui | 326/33 |
| 5,341,045 | 8/1994 | Almulla . | |
| 5,430,400 | 7/1995 | Herlein et al. | 327/407 |
| 5,477,172 | 12/1995 | Schnizlein . | |
| 5,532,620 | 7/1996 | Seo et al. . | |
| 5,654,664 | 8/1997 | Park et al. | 326/81 |
| 5,668,483 | 9/1997 | Roohparva | 326/34 |
| 5,801,548 | 9/1998 | Lee et al. | 326/33 |

FOREIGN PATENT DOCUMENTS

| | | |
|---|---|---|
| 0 467 352 | 1/1992 | European Pat. Off. . |
| 0 590 326 | 4/1994 | European Pat. Off. . |

*Primary Examiner*—Michael Tokar
*Assistant Examiner*—Don Phu Le
*Attorney, Agent, or Firm*—Venable; Robert J. Frank

[57] ABSTRACT

A multiple-power IC device comprising an input buffer circuit for receiving an input signal and a plurality of power voltages of different magnitudes. The input buffer circuit has an output associated with each of the plurality of power voltages for outputting the input signal in accordance with a predetermined threshold voltage. The device further comprises an internal circuit, a switching circuit interposed between the input buffer circuit and the internal circuit, and a power voltage determination circuit coupled to the switching circuit and receiving the plurality of power voltages. The power voltage determination circuit controls the switching circuit to selectively couple an output of the input buffer circuit to the internal circuit in accordance with the magnitude of the received power voltage. Thus, the input signal is coupled to the internal circuit according to the predetermined threshold voltage regardless of the power voltage applied to the input buffer circuit.

2 Claims, 2 Drawing Sheets

MULTI-POWER IC DEVICE

BACKGROUND OF THE INVENTION

1. Field of the Invention

The present invention relates to a multiple-power IC device such as a multiple-power semiconductor integrated circuit which has an input buffer circuit compatible with a plurality of powers.

2. Description of the Prior Art

In general, the input terminal of a semiconductor IC device has an input buffer circuit which functions as an interface. This input buffer allows signals to be sent from the input terminal to the internal circuit of a semiconductor IC device based on a threshold according to the voltage supplied to the input buffer circuit.

This type of IC device is usually built on a printed circuit board. For a printed circuit board to be used as a TTL logic circuit, two power voltage levels, 3V and 5V, are supplied in most cases. And, depending upon the environment in which this IC device is used, a 3V or 5V power level is selected for use in the input buffer circuit of the IC device built on the circuit board.

In many cases, a Complementary Metal Oxide Semiconductor (CMOS) buffer is used as a multi-voltage-power input buffer. Upon receiving an input signal, this CMOS buffer sends an output signal to the internal circuit according to its threshold. This threshold is determined by two factors: one is the ratio between the p-channel MOSFET gate width and the n-channel MOSFET gate width of the CMOS buffer and the other is the voltage of the power supplied to the buffer. And, by matching the threshold of this buffer to the medium between the L (low) level and the H (high) level of the input signal, a sufficient noise margin is provided for each of both the L level and the H level of the input signal.

For example, when a TTL-level signal with an amplitude of about 3V is sent to a buffer with a power voltage of 5V and when the threshold of the buffer is 1.5V which is about the medium of the input signal level, it is possible for the buffer to match the threshold to the medium of the L level and H level of the input signal. In this case, a sufficient margin is provided for each of the L level noise and the H level noise.

However, when a 3V driving power is supplied to a buffer whose threshold is 1.5V for a 5V power voltage, the threshold varies; for example, it is lowered to 0.9V. This makes the L level noise margin for the input signal extremely small. Thus, the threshold of the conventional multiple-power IC circuit varies according to the driving power of the input buffer, resulting in a variation in the input signal noise margin.

It is an object of the present invention to provide a multiple-power IC device in which the threshold of the input buffer circuit does not vary even if the input buffer circuit voltage is selected from a plurality of voltages. It is another object of the present invention to provide a multiple-power IC device in which the input signal noise margin does not vary according to the power voltage.

SUMMARY OF THE INVENTION

To solve the above problems, the present invention has the following configuration.

Basically, a multiple-power IC device according to the present invention comprises: an input buffer circuit to which one of a plurality of power voltages may be applied; an internal circuit connected to the input buffer; and a switching terminal connected to, and electrically coupled to the input buffer circuit, wherein the input buffer circuit sends output signals, corresponding to input signals, to the internal circuit according to a threshold and wherein the switching circuit holds the threshold of the input buffer circuit at a desired voltage level regardless of the power voltage applied to the input buffer circuit.

A multiple-power IC device according to the present invention has the switching circuit set the threshold of the input buffer circuit to an appropriate value, regardless of the voltage to be applied. This prevents the threshold from being changed even if the power voltage changes.

Therefore, it is possible to provide a multiple-power IC device in which the threshold is not affected by, and the input signal noise margin is not subject to, the selected power voltage. The threshold should be set approximately to the medium between the L level and the H level of the input signal. The present invention is most suited to a multiple-power IC device to which TTL level signals are sent.

The switching circuit may have a power voltage determination circuit, which checks the power voltage to control the input buffer circuit operation automatically.

The input buffer circuit may comprise a plurality of input buffers. Upon receiving input signals, each buffer is capable of generating signals, with the same threshold, regardless of the differences among the power voltage levels. The switching circuit selects one of the input buffers according to the power voltage, thus preventing the threshold from being changed.

The input buffer circuit may comprise a CMOS buffer which comprises a p-channel MOSFET with a gate and an n-channel MOSFET with a gate and connected in series with the p-channel MOSFET; and an auxiliary MOSFET with a gate and with the same type of channel as that of one of the MOSFETs connected in parallel.

The switching circuit turns on or off the voltage to be applied to the gate of the auxiliary MOSFET. Turning on or off the voltage of the gate of the auxiliary MOSFET effectively changes the gate width ratio between both MOSFETs constituting the CMOS buffer. A change in the gate width ratio allows the threshold of the input buffer circuit to be fixed regardless of the power voltage.

BRIEF DESCRIPTION OF THE DRAWINGS

The present invention will be understood more fully from the detailed description and the accompanying drawings of the preferred embodiments of the invention.

In the drawings.

DESCRIPTION OF THE PREFERRED EMBODIMENTS

Figure 1:
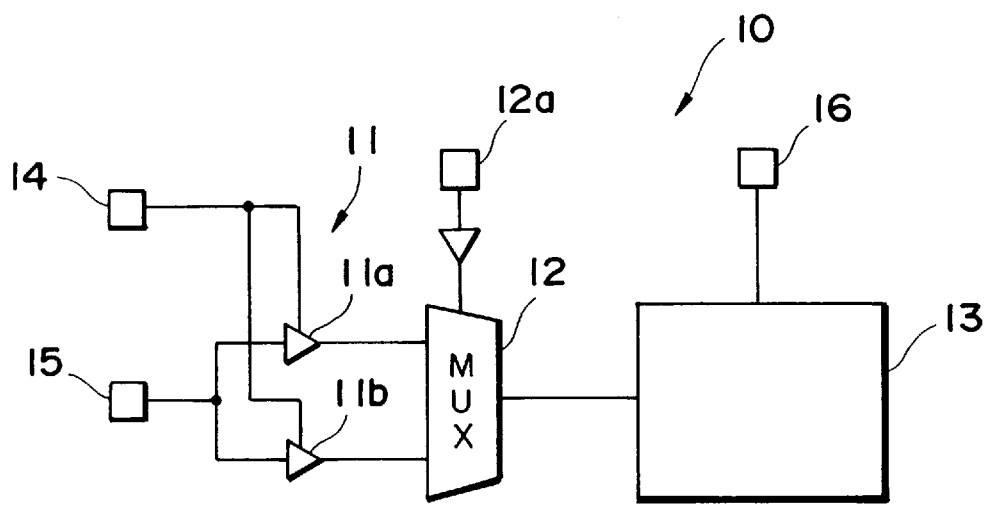
FIG. 1 is a circuit diagram showing a first embodiment of the multiple-power IC device according to the present invention.

The invention will be described in further detail by way of embodiments with reference to the accompanying drawings. FIG. 1 is a circuit diagram showing the first embodiment of the multiple-power IC device according to the present invention. For simplicity, the ground (GND) terminal and its associated wiring are not included in the figure.

As shown in FIG. 1, the multiple-power IC device 10 according to the present invention comprises a input buffer circuit 11 comprising input buffers (11a and 11b), a switching circuit multiplexer 12 for selecting one of the input buffers, and internal circuit 13 to which signals are sent from the input buffer circuit 11. The multiple-power IC device 10 is built on a printed circuit board (not shown in the figure) to which one of two power voltages, for example, 3V and 5V, is supplied.

In the embodiment of FIG. 1, the input buffer circuit 11 typically comprises two CMOS buffers, 11a and 11b. When the 5V power is applied to one of the CMOS buffers, 11a, its threshold is set to 1.5V which is the medium of the ITL-level signal amplitude. On the other hand, when the 3V power is applied to the other CMOS buffer, 11b, its threshold is set to 1.5V which is the same as that of the CMOS buffer 11a.

The 3V or 5V power is supplied to the power voltage terminal 14 and, via that terminal, the 3V or 5V power voltage is supplied to input buffers 11a and 11b. On the other hand, TTL-level signals are sent to input buffers 11a and 11b via the common signal input terminal 15. On the output side of input buffers 11a and 11b is provided the multiplexer 12 which connects these buffers to the internal circuit 13. The internal circuit 13 shown in the figure operates, for example, on the 3V power supplied to the power terminal 16.

The multiplexer 12 located between the input buffer circuit 11 and the internal circuit 13 comprises the switching circuit (MUX) sending signals from input buffers 11a or 11b to the internal circuit 13 as determined by the switching operation terminal 12a.

On the multiple-power IC device 10 according to the present invention, the switching operation terminal 12a selects one of the buffers, 11a or 11b, according to the environment in which the circuit board containing the IC is used. That is, when the 5V power is selected for the input buffer circuit 11, the switching operation terminal 12a selects input buffer 11a which is set up as a 5V TTL buffer; when the 3V power is selected for the input buffer circuit 11, the switching operation terminal 12a selects input buffer 11b which is set up as a 3V TTL buffer. This allows the input switching circuit 12 to select the buffer 11a or 11b with an appropriate threshold according to the power voltage, thus always ensuring the effective TTL-level signal threshold of 1.5V.

Therefore, the multiple-power IC device 10 according to the present invention always sets the threshold to the medium of the input signal amplitude regardless of which power voltage is selected; this makes the optimum noise margins always available for both the L level noise and H level noise of the input signals.

There is shown a multiple-power IC device of the second embodiment according to the present invention. For simplicity, the ground (GND) terminal and its associated wiring are not included in FIG. 2.

Figure 2:
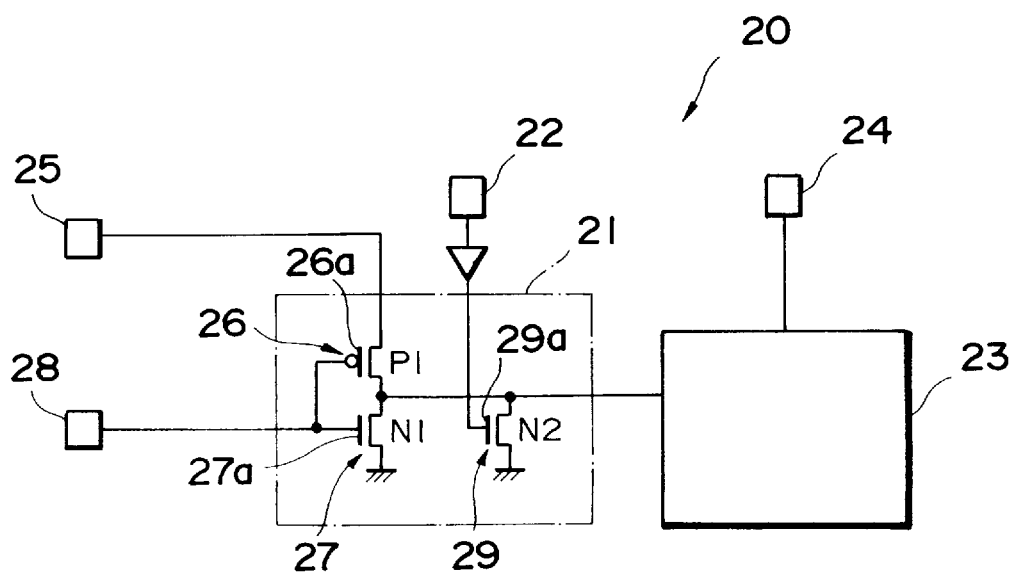
FIG. 2 is a circuit diagram showing a second embodiment of the multiple-power IC device according to the present invention.

As shown in FIG. 2, the multiple-power IC device 20 according to the present invention comprises the input buffer circuit 21, terminal 22 for controlling the operation of the input buffer circuit 21, and internal circuit 23 to which signals are sent from the input buffer circuit 21. As with the multiple-power IC device 10 of FIG. 1, the multiple-power IC device 20 is built on a printed circuit board (not shown in the figure) to which one of two power voltages, for example, 3V and 5V, is supplied for TTL-level signals. The internal circuit 23 operates, for example, on the 3V power applied to the power terminal 24.

In the embodiment shown in FIG. 2, the input buffer circuit 21 from which signals are sent to the internal circuit 23 has a p-channel MOSFET 26 an n-channel MOSFET 27, connected in series, between the power voltage terminal 25 and ground, as in the conventional CMOS buffer. The inverted input signal is sent from the signal input terminal 28 to the gate 26a at the input of the MOSFET 26; the non-inverted input signal is sent from the signal input terminal 28 to the gate 27a at the input of the MOSFET 27.

At the same time, the n-channel MOSFET 27 is connected in parallel with the auxiliary n-channel MOSFET 29. The terminal 22 is connected to the gate 29a of this auxiliary MOSFET 29. This terminal 22 has the means for applying a gate voltage to the auxiliary MOSFET 29 to turn it on. On the other hand, turning off the gate voltage to the auxiliary MOSFET 29 turns off the auxiliary MOSFET 29. Therefore, turning on or off the gate voltage applied to the terminal 22 turns on or off the auxiliary MOSFET 29.

When off, the auxiliary MOSFET 29 is electrically disconnected. In this case, the gate width ratio in the input buffer 21, that is, the gate width ratio between the MOSFET 26 and the MOSFET 27, is represented as Wp:Wn1, where Wp is the gate width of the p-channel MOSFET 26 and Wn1 is the gate width of the n-channel MOSFET 27. On the other hand, when the auxiliary MOSFET 29 is on, the gate width ratio in the input buffer circuit 21 is represented as Wp: (Wn1+Wn2). In this case, the gate width ratio in the input buffer circuit 21, that is, the gate ratio between the MOSFET 26 and the MOSFET 27, is reduced effectively by additional gate width Wn2.

Thus, selecting the gate widths of the MOSFETs, 26, 27, and 29, appropriately, while taking into consideration the voltage applied to the power voltage terminal 25, allows the threshold to be set up. For example, when the 5V power is supplied to terminal 25, the threshold of the input buffer circuit 21, with the auxiliary MOSFET 29 turned on, is 1.5V; when the 3V power is supplied to terminal 25, the threshold of the input buffer circuit 21 with the auxiliary MOSFET 29 turned off is 1.5V regardless of a variation in the power voltage.

Typically, it is possible to set the gate width ratio, Wp: (Wn1+Wn2), in the input buffer circuit 21 for the 5V TTL buffer to 1:3, and the gate width ratio, Wp:Wn1, for the 3V TTL buffer to 1:1. It should be noticed that this ratio may vary according to a variation in the characteristics of each MOSFET.

FIG. 2 shows the multiple-power IC device 20 containing the n-channel MOSFET 27 and the auxiliary MOSFET 29 connected in parallel. Instead of this configuration, the p-channel MOSFET 26 may be connected in parallel with another p-channel MOSFET which functions as an auxiliary MOSFET.

Figure 3:
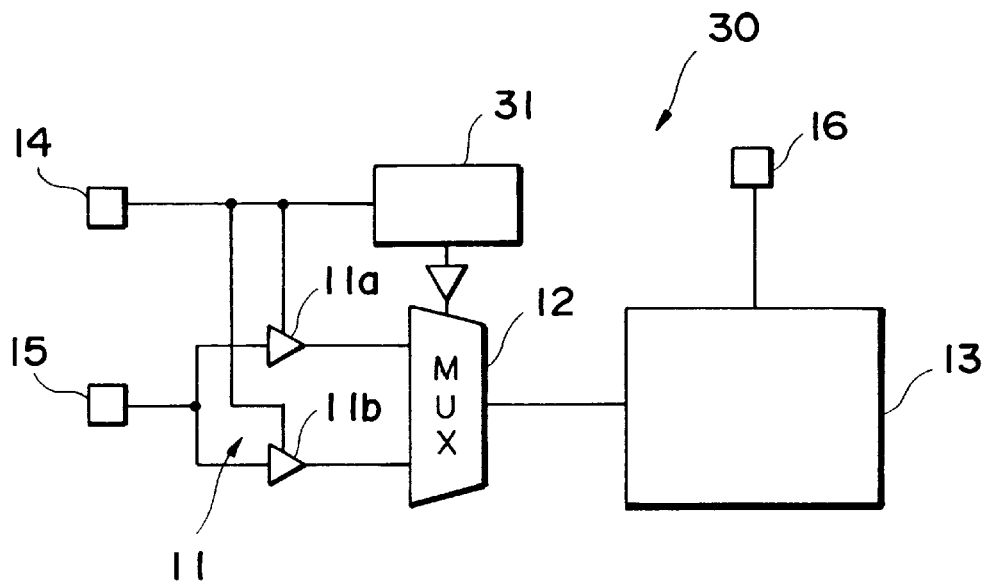
FIG. 3 is a circuit diagram showing a third embodiment of the multiple-power IC device according to the present invention.

There is shown in FIG. 3 a multiple-power IC device of the third embodiment according to the present invention. For simplicity, the ground (GND) terminal and its associated wiring are not included in FIG. 3. And, those functional modules shown in FIG. 1 are numbered the same way as in FIG. 1 and their descriptions are omitted. The multiple-power IC device 30 shown in FIG. 3 comprises the multiple-power IC device shown in the first embodiment plus the power voltage determination circuit 31.

Upon detecting a voltage applied by the power voltage terminal 14, the power voltage determination circuit 31 activates the switching circuit 12 according to the applied voltage. More specifically, upon detecting that the 5V power is supplied to the CMOS buffers 11a and 11b, the switching circuit 12 selects the input buffer 11a for the 5V TTL signals and, upon detecting that the 3V power is supplied, selects the CMOS buffer 11b for 3V TTL signals.

Thus, the multiple-power IC device 30 eliminates the need for manually operating the switching operation terminal 12a of FIG. 1. Instead, regardless of whether the voltage of the power voltage terminal 14 is 3V or 5V, the power voltage determination circuit 31 automatically determines the voltage in order to assign the input buffer circuit 11 an appropriate threshold value. This prevents setting errors on the switching operation terminal 12a, such as those caused by the operator, and also prevents variations in the noise margins introduced by setting errors.

Figure 4:
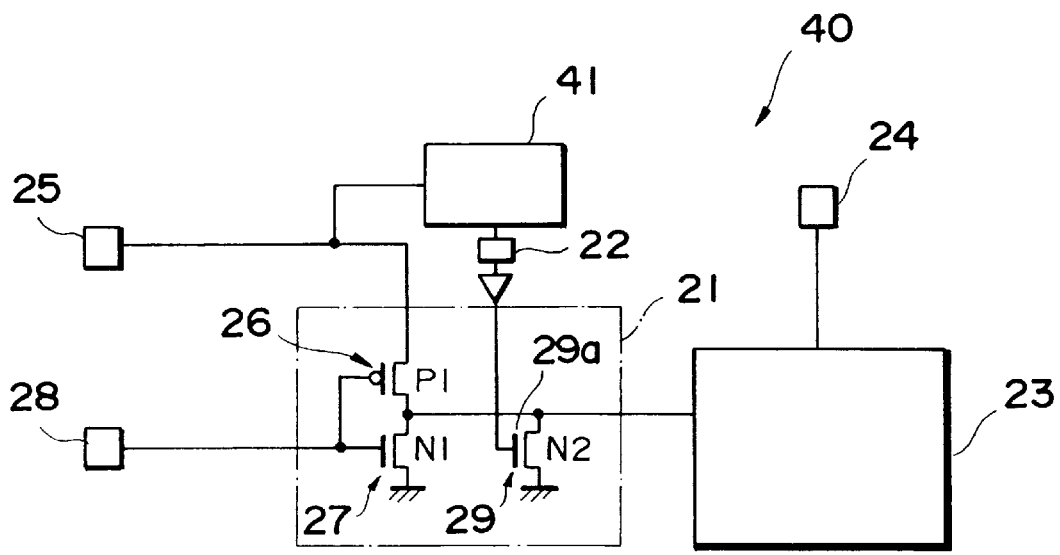
FIG. 4 is a circuit diagram showing a fourth embodiment of the multiple-power IC device according to the present invention.

There is shown in FIG. 4 a multiple-power IC device of the fourth embodiment according to the present invention. For simplicity, the ground (GND) terminal and its associated wiring are not included in FIG. 4. And, those functional modules shown in FIG. 2 are numbered the same way as in FIG. 2 and their descriptions are omitted. The multiple-power IC device 40 shown in FIG. 4 comprises the multiple-power IC device shown in the second embodiment plus the power voltage determination circuit 41.

The power voltage terminal 25 applies a voltage to the power voltage determination circuit 41. The power voltage determination circuit 41 checks the voltage applied by the power voltage terminal 25 to control the gate voltage application terminal 22, which functions as the switching circuit, according to the applied voltage. More specifically, upon detecting that the 5V power is supplied from the power voltage terminal 25 to activate the input buffer circuit 21, the terminal 22 turns on the auxiliary MOSFET 29 to make the input buffer circuit 21 available for use as the 5V TTL buffer.

Thus, regardless of whether the voltage of the power voltage terminal 25 is 3V or 5V, the multiple-power IC device 40 uses the power voltage determination circuit 41 to determine the voltage automatically and assigns the input buffer circuit 11 an appropriate threshold value. This prevents setting errors as well as variations in the noise margins introduced by setting errors.

The invention may be embodied in other specific forms without departing from the spirit or essential characteristics thereof.

As described above, the multiple-power IC device according to the present invention has a switching circuit to set the threshold of the input buffer circuit to an appropriate value, regardless of the voltage to be applied. This allows the input buffer circuit to have a fixed threshold regardless of the differences among the voltages to be applied to the input buffer. This, in turn, allows the multiple-power IC device to have a constant input signal noise margin.

What is claimed is:

1. A multiple-power IC device comprising:

an input buffer circuit for receiving an input signal and a plurality of power voltages of different magnitudes, said input buffer circuit having an output associated with each of said plurality of power voltages for outputting said input signal in accordance with a predetermined threshold voltage;

an internal circuit;

a switching circuit interposed between said input buffer circuit and said internal circuit; and a power voltage determination circuit coupled to said switching circuit and receiving said plurality of power voltages said power voltage determination circuit controlling said switching circuit to selectively couple an output of said input buffer circuit to said internal circuit in accordance with the magnitude of the received power voltage, whereby the input signal is coupled to said internal circuit according to said predetermined threshold voltage regardless of the power voltage applied to the input buffer circuit;

wherein said input buffer circuit comprises a plurality of input buffers, each of said input buffers having an output, an input for receiving said input signal, and an input for receiving said plurality of power voltages, the threshold voltage of each of said input buffers equaling said predetermined threshold voltage for an associated power voltage.

2. A multiple-power IC device as set forth in claim 1, wherein said input buffer circuit comprises a CMOS buffer.

* * * * *